United States Patent [19]
Chu et al.

[11] Patent Number: 5,166,959
[45] Date of Patent: Nov. 24, 1992

[54] PICOSECOND EVENT TIMER

[75] Inventors: David C. Chu, Woodside; Thomas A. Knotts, Half Moon Bay, both of Calif.

[73] Assignee: Hewlett-Packard Company, Palo Alto, Calif.

[21] Appl. No.: 810,946

[22] Filed: Dec. 19, 1991

[51] Int. Cl.$^5$ .............................................. H03K 5/26
[52] U.S. Cl. ........................................ 377/20; 377/33; 377/56
[58] Field of Search ........................ 377/20, 33, 34, 56

[56] References Cited
U.S. PATENT DOCUMENTS
4,764,694 8/1988 Winroth ................................ 377/20
4,908,784 3/1990 Box et al. .............................. 377/20

OTHER PUBLICATIONS
"Phase Digitizing Sharpens Timing Measurements" by David C. Chu, IEEE Spectrum, Jul., 1988, pp. 28–32.
"Phase Digitizing: A New Method for Capturing and Analyzing Spread-Spectrum Signals" by David C. Chu, Hewlett-Packard Journal, Feb., 1989, pp. 28–35.
"Analysis of Spread Spectrum Signals Using a Time and Frequency Analyzer" by David C. Chu and R. F. Schneider, Hewlett-Packard brochure, Apr. 1988.

*Primary Examiner*—Janice A. Howell
*Assistant Examiner*—Scott A. Ouellette

[57] ABSTRACT

A circuit for time stamping event signals, e.g. zero-crossings, using coarse and fine timers. The fine timer is a circuit section which subdivides a period from a phase-locked ring-oscillator into 2N subparts. An event signal is timed by latching a digital representation of a particular subpart. The digital representation of the subpart is an N-bit dual thermometer code which uniquely identifies each subpart with each adjacent subpart differing by only one bit. The subparts are made finer in time quantization than the propagation delay of one active element in the ring oscillator by the use of linear combiner elements. The dual thermometer code, encoded post-latching into a binary code, forms the "fine" timing part of a binary word representation of the event time. The event also latches the count states of a pair of lead-lag counters in a master-slave configuration counting ring oscillator periods. These counters change states respectively before and after the dual thermometer code turn-overs. Only one reading is chosen for recording as determined by the most significant bit of the fine code. The choice will always find an accurate and stable reading, and reject erroneous readings resulting from reading a counter in transition. The chosen counter reading, encoded to binary, forms the coarse timer for the binary word representation of the event time. The coarse and fine binary words are butt-joinable to form the complete binary timing representation without further arithmetic processing.

20 Claims, 13 Drawing Sheets

PICOSECOND EVENT TIMER

DESCRIPTION

1. Technical Field

The invention relates to timing circuits and, in particular, to a circuit which times an event, namely a signal zero crossing, and produces a digital representation of the timed event.

2. Background Art

The signal digitizing method used in the Hewlett-Packard 5371A Frequency and Time Analyzer is an example of a very useful type of signal representation based on continuous counting and sampling only at signal zero crossings. By means of this method it is possible to directly digitize the phase progression of the signal, thereby eliminating any need for the previously-required steps of voltage digitizing and voltage-to-phase conversion. The procedure may therefore be appropriately called "phase progression digitizing," or "phase digitizing". Amplitude information is discarded.

Phase digitizing is illustrated in FIG. 3, which shows signal sample locations, represented by dark dots, on a sinusoidal signal of changing frequency. Samples occur at occasional upcrossings at a relatively constant rate. Each sample produces two increasing numbers, the total cycle count and the time stamp at that point. The cycle count comes from reading a counter counting the signal. Every cycle is counted, not just those on which a sample occurs. When a sample occurs, a synchronizer gates the upcrossing of the cycle during which the sample occurs so as to time-stamp that cycle. This is accomplished by reading another counter which continuously counts a 500 MHz time base clock. With interpolation, the resolution is improved from 2 ns to 0.2 ns. In phase digitizing, down-crossings of the event signal, as well as upcrossings or as an alternative to upcrossings, can be time stamped.

The interpolation technique of the prior art is based on delay propagating through distributed high-speed flip-flops. As shown in FIG. 4, two latched signals, representing the event occurrence and the clock, go to a bank of nine high-speed D flip-flops which determine the relative phase between the two signals at nine equally spaced delay stages. The total delay spans the 2-ns period of the time base clock.

The event latch signal is progressively delayed by 200 ps per stage (one time quantum per stage). Flip-flop outputs will quantize the delay time interval with logical one and zero outputs indicating event latch delay. The flip-flops output a thermometer code, which is converted into a binary code and stored with the event count and time count in a memory system. The thermometer code counts as follows 000...000, 100...000, 110...000, 111...000, ..., 111...110, 111...111. At the end of the count, the code does not reset itself to zeros. The interpolator output, converted from thermometer code to binary, plus the digital representation of the event count, yields the digitized time of event signal.

There are a number of problems associated with this prior art method. Since the latching elements are discrete components, they do not match well. Good linearity is achieved only by individual adjustments of each element. Besides linearity, the total delay must match 1 period of the non-subdivided clock interval, for accuracy. The timing resolution is determined by the physical separation between discrete latching elements. In many delay lines, delays are set a priori and subject to variations. Both linearity and accuracy will be degraded with circuit parameter variations. Also delay lines sit idle until activated by a measurement. Thus, both accuracy and linearity change to some degree with various measurement rates.

This method also requires N-1 latching elements to interpolate N subparts. It would be desirable to reduce the number of latches relative to the number of subparts.

Another problem in the prior art is the necessity to actually isolate a particular clock pulse with a synchronizer, and to do so with low time jitter. The metastability of the synchronizing process makes this difficult, particularly at high frequencies. A circuit is "metastable" if a small jitter in one signal does not result in a sudden, large change in another. A lack of metastability is manifest during a transition of a pulse. More particularly, slight variations between the phase of a transition in an input signal and the phase of a transition in a reference signal can result in large and erroneous variations in an output signal. For example, in FIG. 11 the transition of a conventional counter or synchronizer is shown to be misaligned, i.e. skewed, with an event measuring pulse stream in plot A due to the statistical fluctuations mentioned above. If a measurement is made at the time indicated by vertical line $\alpha$, the count is read as 63 or $((3 \times 16) + 15)$. If a measurement is made slightly later at time $\beta$, the count is 48 or $((3 \times 16) + 0)$. If a measurement is made at time $\gamma$, the count is 64 or $((4 \times 16) + 0)$. These counting uncertainties occur with high probability and produce serious systematic error.

SUMMARY OF INVENTION

The above problems have been overcome in an event timer which, like the prior art, uses an interpolator for fine time stamping between timed events, but has good linearity, improved accuracy and reduces the number of latches in forming the delay subparts. The new timer produces nearly uniform delay between elements, and reduces statistical error arising from metastability and pulse jitter, yielding a more reliable time stamp.

The event timer of the present invention uses a ring oscillator as a synchronizer substitute in the interpolator. The ring oscillator employs active circuit elements phase locked to a reference frequency standard to subdivide each clock pulse, together with linear combining elements (LCE) to achieve the desired degree of fine divisions without a tapped delay line. The LCE produce as outputs a modified thermometer code which is cyclic in time at the clock rate. It reverse counts over alternate half cycles, thereby providing uniform interpolation for 2 N subparts with only N digits with a unique signal identifier for each delay subpart. In this modified thermometer code only one digit changes state between adjacent subparts. The event counter features lead and lag counters, which are offset in phase relative to the interpolator. By providing such lead-lag signals, metastable states, jitter and skew do not interfere with event time stamp counts. The output of the event counter provides a coarse time stamp which is combined with the fine time stamp of the interpolator. Time resolution is faster than presently available transistor gate delays, i.e. on the order of 15 picoseconds.

Good linearity is achieved without adjustments by using identical, tunable active delay elements which can be fabricated in a monolithic integrated circuit. Accuracy is maintained dynamically by continuous comparison with a frequency reference, even during measurements, and not subject to circuit parameter variations. A phase locked oscillator mimics the "tapped delay line", which is the oscillator itself. The oscillator is cyclically and continuously exercised whether a measurement is being made or not. Hence the circuit is less susceptible to changing measurement rates. The ring oscillator configuration has inherent half-wave symmetry, thereby allowing the use of a modified thermometer code which needs only N/2 latches to interpolate N subparts—about half as many as needed in a prior art device. The use of LCE allows the degree of fine division to be below the propagation delay of a single ring oscillator delaying elements. Time resolution on the order of 60 ps is achieved for the delay elements. And with LCE the resolution is about 15 ps.

The problem of synchronizing between the interpolation and the main clock (fine and coarse) is solved by using two counters, one leading and one lagging the cyclic turnover of the modified thermometer code. Both counters have outputs stored in latches but only the appropriate one is recorded. The most significant bit (MSB) of the "fine" code determines which is recorded. With this method, ambiguity induced by reading a counter on-the-fly is eliminated, for the counter which is read while switching will never be recorded. Furthermore, no synchronizer circuit is necessary to isolate a particular clock pulse for measurement. Indeed, this method is very tolerant of the lack of coherence between the fine and coarse parts of the interpolation. Within large limits, jitter between fine and coarse clocks is inconsequential.

As an added bonus of this method, the coarse and fine data so obtained are "butt-joinable", i.e. may be placed side-by-side to form a wider word without arithmetic processing. This joined word then forms a new "fine" code, and the same scheme is cascadable toward more significant or "coarse" bits thereby yielding an extended range for the circuit.

BEST MODE FOR CARRYING OUT THE INVENTION

Figure 1:
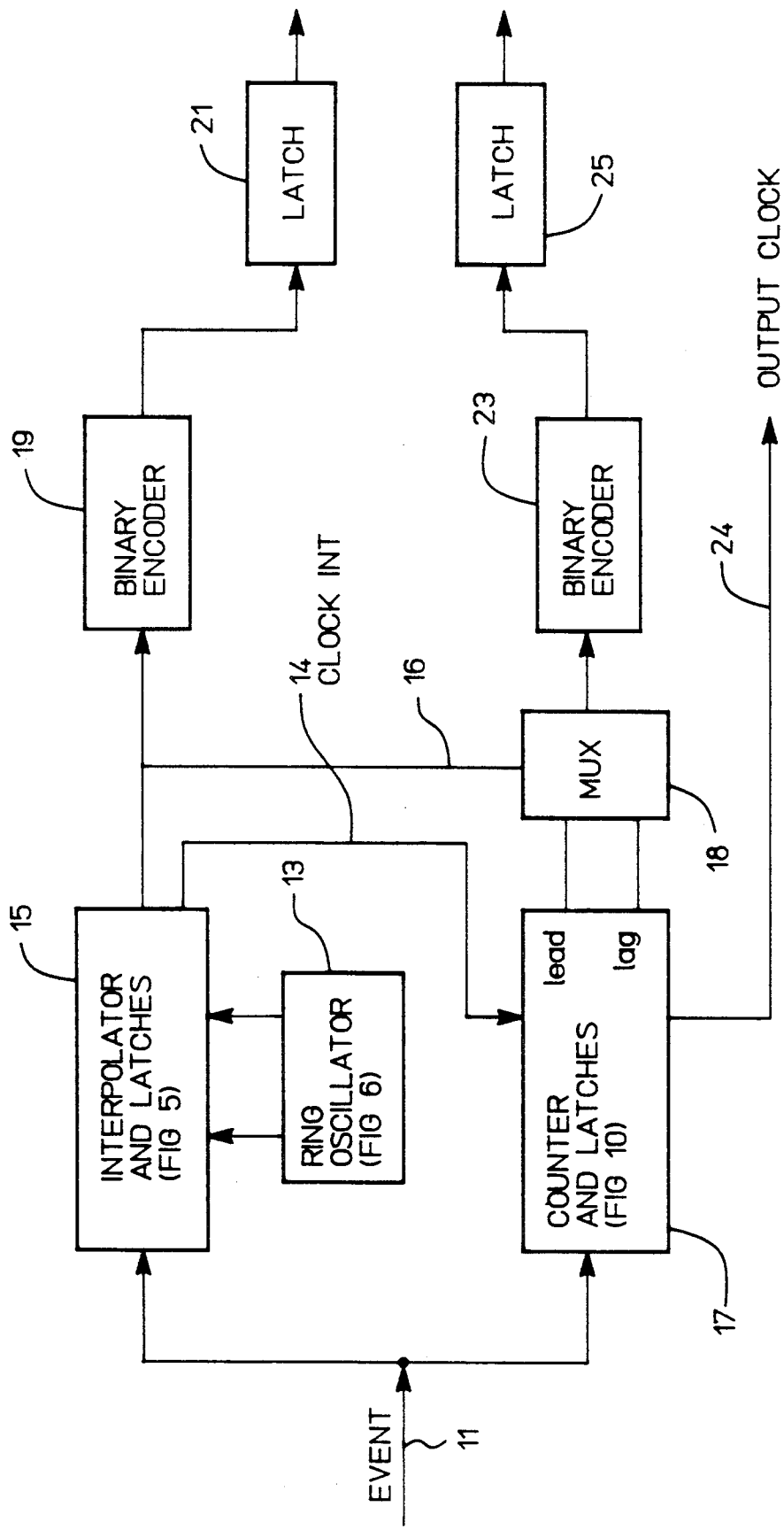
FIG. 1 is a simplified electrical block diagram of the timing circuit of the present invention.

With reference to FIG. 1, the overall architecture of the circuit of the present invention may be seen. There are two parallel paths from the event input, on the left, to the device output, on the right. The device input is a signal line 11 which carries an event signal whose positive zero crossing is to be measured relative to the zero of the output clock 24, a locally generated signal. Internal clock pulses are generated by ring oscillator 13 which transmits a stream of identical pulses to interpolator 15 and counter 17. Ring oscillator 13 is phase locked for stability to a reference clock, not shown. Delay in the ring oscillator, whose frequency is voltage controlled, is adjusted with respect to the reference.

Interpolator 15 subdivides clock pulses into subparts and each subpart is labeled with a numbering scheme provided by linear combiner elements described below. The subparts are derived by propagation of delay in an active delay circuit which includes the ring oscillator. The numbering scheme for the propagating delay is a modified thermometer code because each successive subpart changes by one digit, similar to Gray code, except changing from left to right. In physical appearance, the propagation of digits, corresponding to the propagation of delay, looks like a thermometer gradually indicating a change in temperature. An advantage of using thermometer code or Gray code is that any error in resolution of a transition between delay values, i.e. subparts, affects only one bit because these codes change values by one bit between successive subparts. The modification of thermometer code used herein is explained below.

An event signal, e.g. a positive going zero crossing signal, along line 11 latches a subpart for decoding and reading as output. Binary encoder 19 converts the latched thermometer code output to binary coded output which is read by latch 21 as the least significant portion of the output.

The maximum input frequency of events along line 11 is typically less than the frequency of ring oscillator 13, say about one-eighth. The ring oscillator 13, having a 50% duty cycle relative to suppart generation, generates an internal clock signal, CLK INT, along line 14. The relatively slow clock rate of CLK INT, subdivided into extremely fine intervals, allows high event resolution. An event which is asynchronous in nature, may occur during any one of the subparts of CLK INT. This subpart identification is latched and reported as the fine timing. The coarse timing is found from the number of clock pulses past an initial clock zero counted in lead-lag counter 17 and latched for reading by an event signal transmitted to counter 17.

The lead-lag counter 17 comprises a pair of counters in phase offset relation, one of which is selected by the state of the thermometer code. For example, a thermometer code count of between 0 and 7 may select the lead counter while a count of between 8 and 15 selects the lag counter. This selection can be accomplished by reading a single bit of the thermometer code. This bit is transmitted to multiplexer 18 which selects the appropriate lead or lag counter.

The output of multiplexer 18, i.e. a selected and latched counter output is read by binary encoder 23 which provides a binary coded output, forming the most significant output bits held for reading by latch 25, i.e. the coarse timing information. The two output latches 21 and 25 contain the least to most significant bits of a binary coded output, representing the time in which the event along line 11 occurs relative to the zero of an output clock, along line 24. The output clock may be used to cascade further stages.

Figure 2:
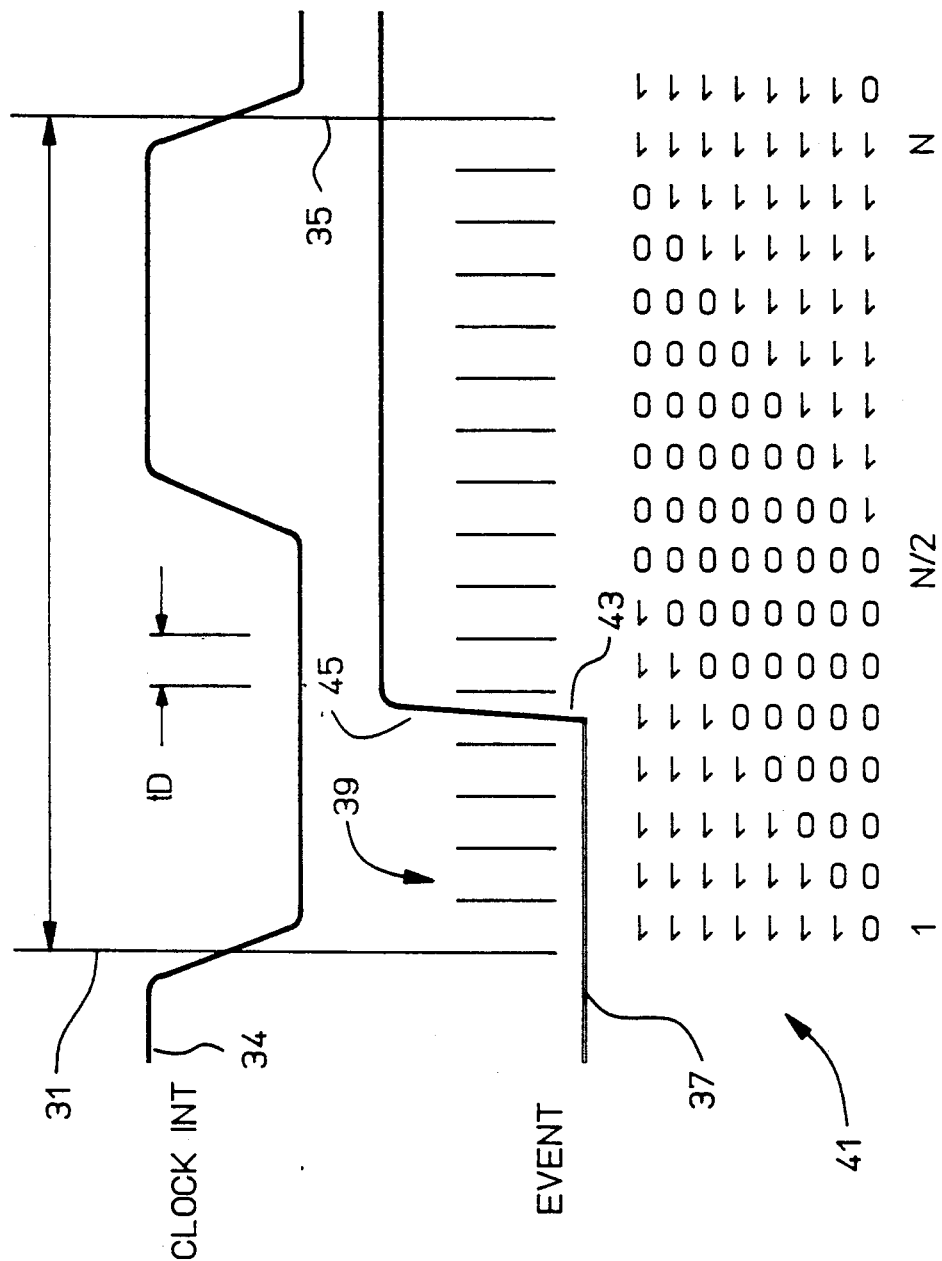
FIG. 2 is a waveform diagram showing division of a clock signal into delay subparts for identifying an event signal.
Figure 3:
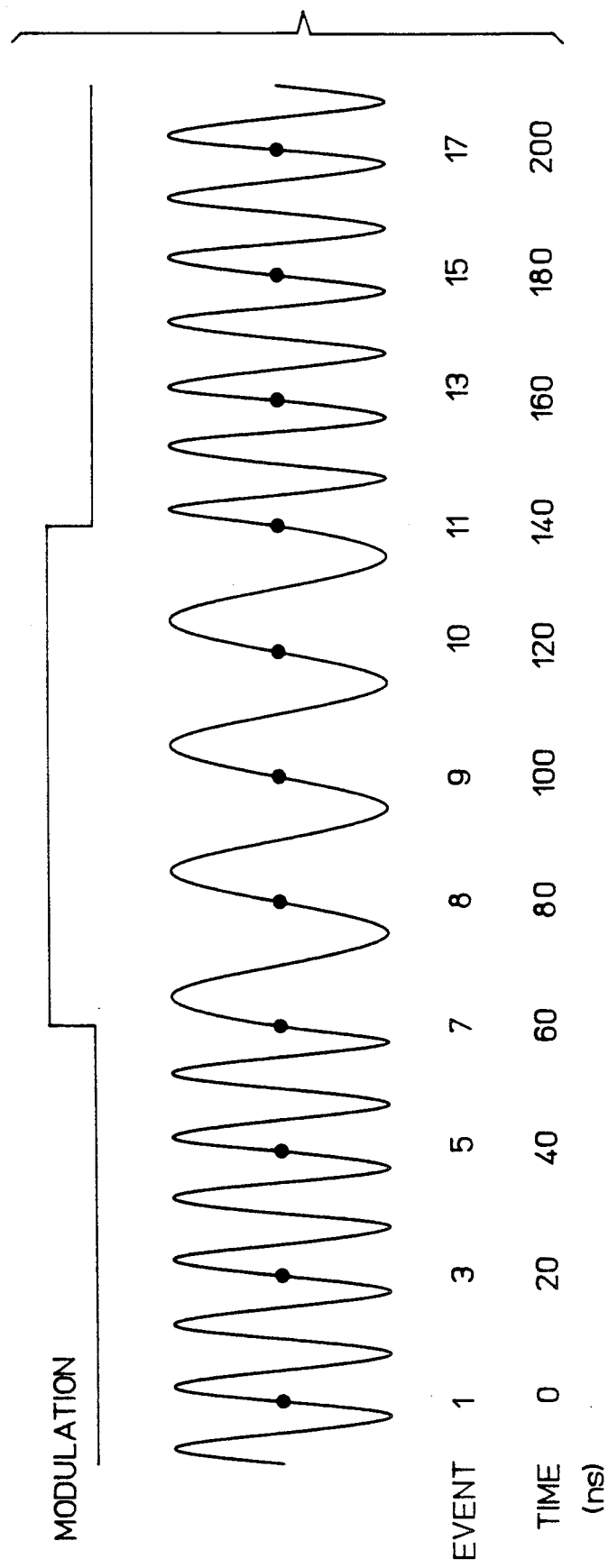
FIG. 3 is a waveform diagram showing prior art signal sampling in phase digitizing.
Figure 4:
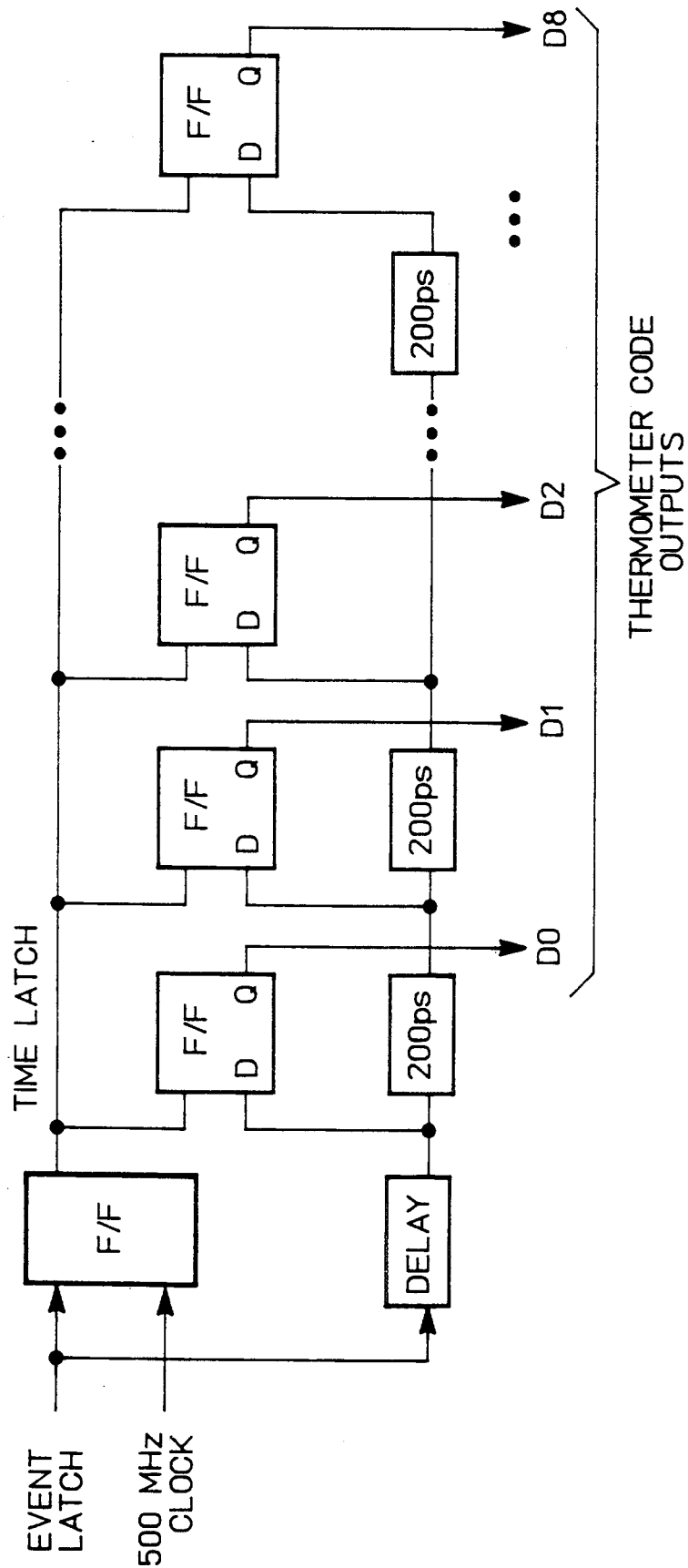
FIG. 4 is a simplified block diagram of an interpolator of the prior art.

In FIG. 2, the beginning of CLK INT is represented by vertical line 31. The first pulse of CLK INT is represented by the line 34 between vertical line 31 and vertical line 35. This pulse is one out of F clock pulses, where F is a number representing the frequency of the clock. To the right of vertical line 35 on clock line 34 is the second clock pulse, which is subdivided into subparts, just like the first pulse. The event signal is represented by line 37. To the right of vertical line 31 are the subdivisions of the first clock pulse, indicated by vertical lines 39.

The interval between vertical lines is a time interval $T_d$ which is uniform between vertical lines. One way to generate the intervals $T_d$ is by a passive delay line with equally spaced-apart taps. However, in order to integrate a circuit, active elements are preferred. Each vertical line denoting the boundary of a subpart, $T_d$, is identified by a number, generated by the propagating delay elements, which vary by one unit in the left most bit with respect to the next number. This is seen by the numbering scheme 41, with each number corresponding to one of the subpart lines 39. Thermometer code begins with the first line, indicated by "1", reading 0 1 1 1 1 1 1 1. The next line reads 0 0 1 1 1 1 1 1 and so on until the line indicated by "N/2" is all zeros. Then the count inverts reading 1 0 0 0 0 0 0 0 and so on until the line indicated by "N" reads all ones. The rising edge 43 of the input event along line 37 will latch one of these codes at the line 45. The modified thermometer code number corresponding to vertical line 45 is held by a latch and converted to binary coded format by the binary encoder 19 in FIG. 1. This inverted counting in alternate half cycles of thermometer code can be used as a result of the inherently precise 50% duty waveform cycle generated by the ring oscillator, thereby permitting fabrication of only 50% of the delay elements to achieve the desired subparts. Inverted counting begins with the subpart interval labeled N/2 in FIG. 2. We call our modified code "dual thermometer code", illustrated by the count from 1 to N subparts in FIG. 2.

In the example of FIG. 2 the rising edge 43 along the event line occurred during the first clock pulse along line 34. Typically, the event has a probability (1/64) of occurring during any one first clock state, but is shown in this manner for example only.

Figure 5:
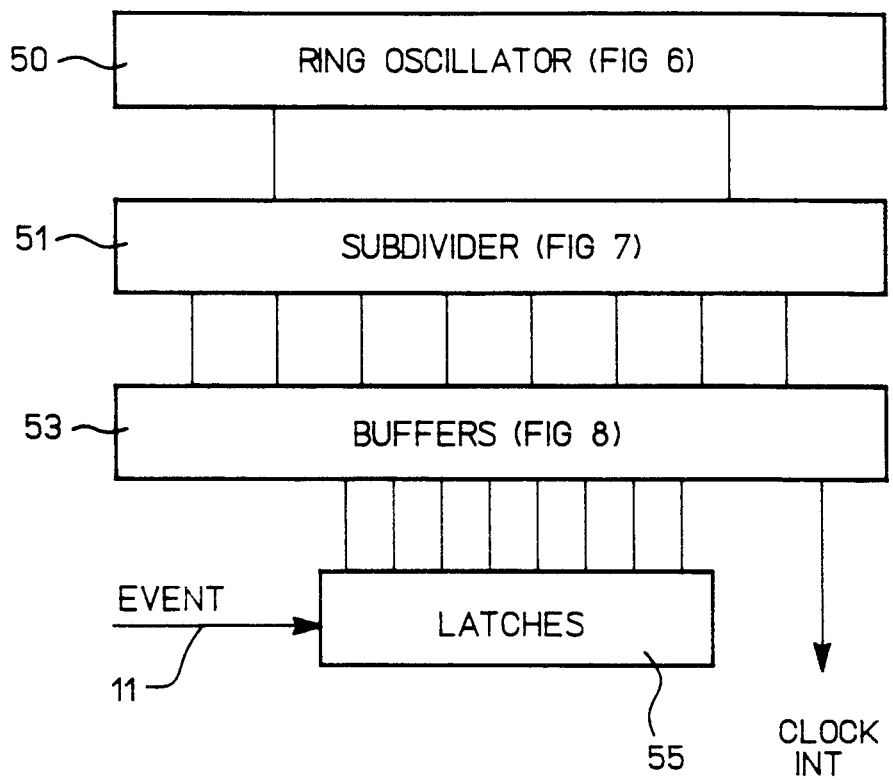
FIG. 5 is a block diagram of the interpolator circuit shown in FIG. 1.

In FIG. 5, the architecture of the interpolator is shown. A Walker oscillator 50 is used to simulate a tapped delay line with equally spaced taps. The Walker oscillator is described in U.S. Pat. No. 4,884,041 and is a ring oscillator having tunable linear combiner elements (LCE) which may produce delay times equal in value, as is the case in the present invention. The ring oscillator 50 feeds clock pulses to a subdivider 51, formed by LCE in the manner previously described. This increases the number of lines with delay signals from 2 to 8 and increases resolution in time by a factor of 4. The outputs of the thermometer code generator are subsequently sent to data buffers 53. The buffer output lines are connected to latches 55 where the event signal, along line 11, is directed for latching a particular reduced thermometer code when the event occurs.

Figure 6:
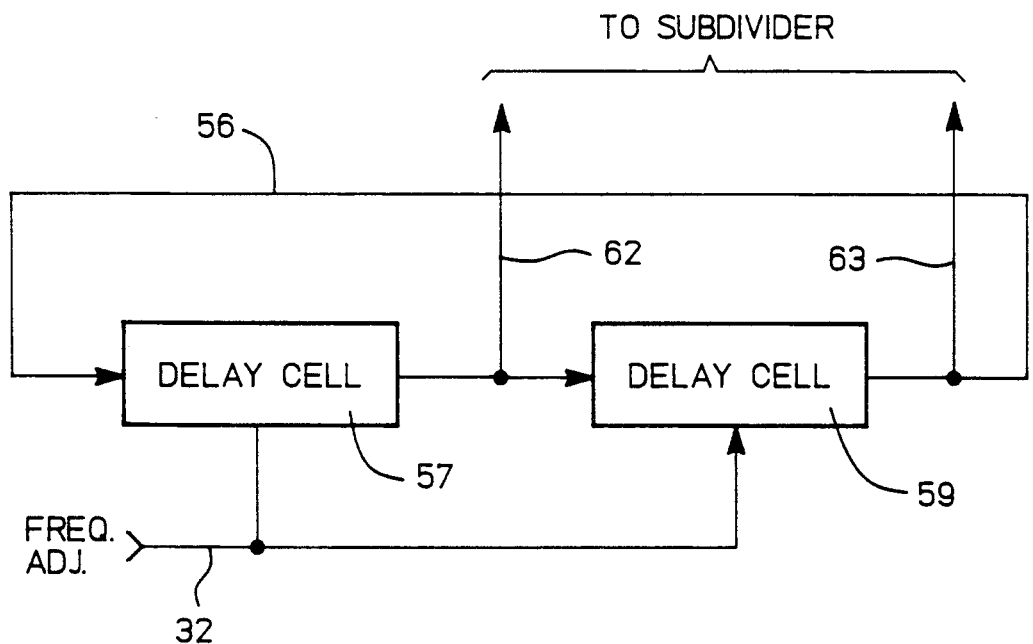
FIG. 6 is a schematic plan of the ring oscillator employed in the circuit of FIGS. 1 and 5.

FIG. 6 is a block diagram of a ring oscillator. A principal feature of such a device is that a voltage along line 32 can adjust the delay of each delay cell 57, 59, and hence the oscillator frequency. A signal on line 56 is delayed by a desired amount by a delay cell 57 so that a delayed output is available at tap line 62. A substantially identical delay cell 59 provides an output along tap line 63. The output on line 63 corresponds to the beginning of the next half duty cycle of CLK INT. The two taps 62 and 63 are used to generate eight delay values by means of signal subdividers or multiplexers.

Figure 7:
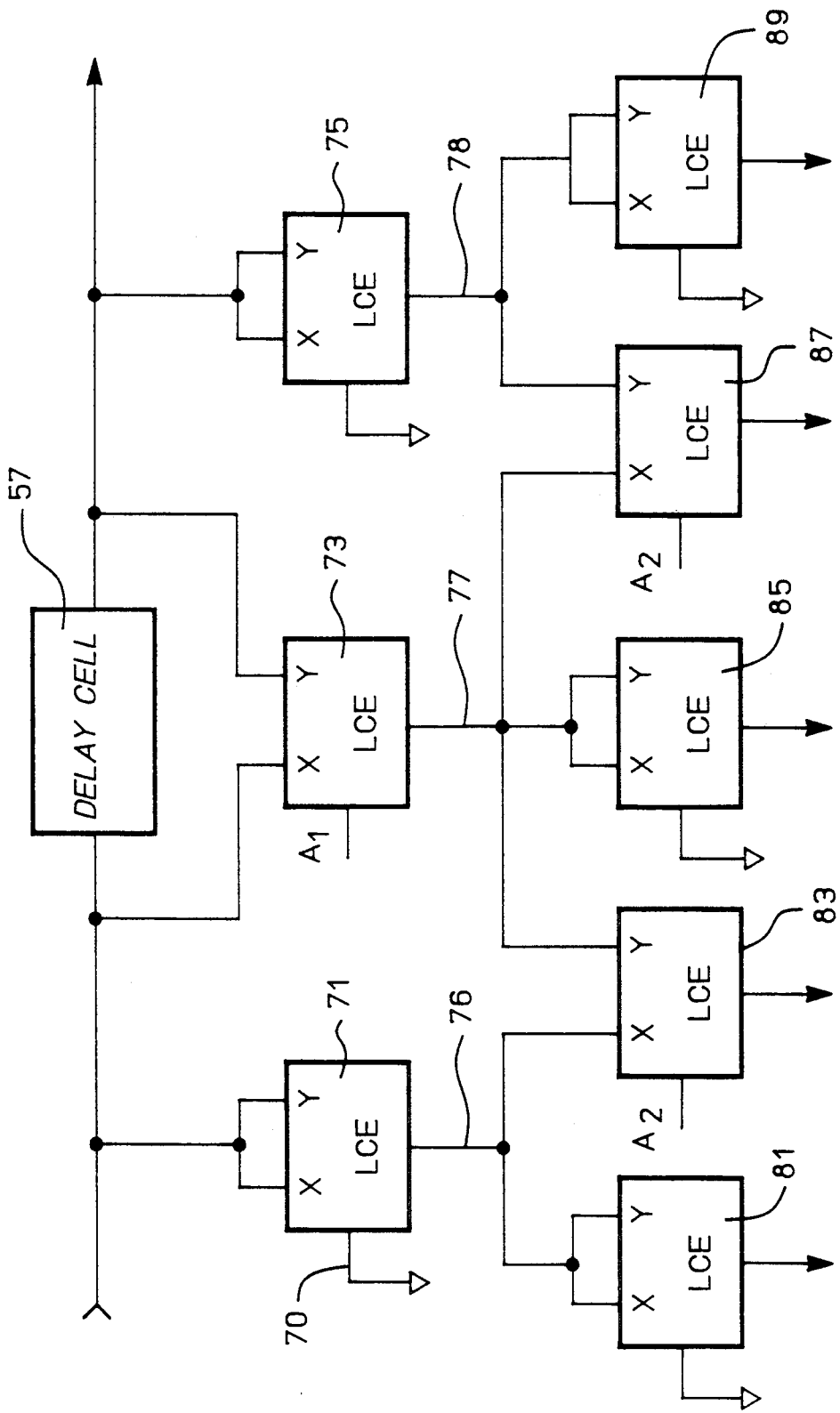
FIG. 7 is a detailed block diagram of a pulse subdivider using linear combiner elements (LCE) employed in the diagram of FIG. 5.

The detail of the subdivider 51 is shown in FIG. 7. A single delay cell 57 of the ring oscillator is shown connected to a plurality of 2:1 linear combiner elements (LCE) 71, 73 and 75 in a first row. An LCE is a weighted multiplexer, with weighting of input signals added by a signal on a tuning line 70 to the left of each LCE block. Most of the LCE weighting lines are shown to be grounded (differential among lines equal to zero) excepting those that have a signal $A_i$, as on LCEs 73, 83 and 87. The number "i" is 1 and 2, representing the first row of LCEs, such as LCE 73, then the second row, and so on for further rows, if any. Where the line is grounded, A=0.5. Each LCE has two inputs and a single output and divides the time interval between the two inputs such that the LCE output Z is equal to $Ax+(1-A)y$ where x and y are two input signals representing time delays and A is a number satisfying $0 \leq A \leq 1$. Preferably, A is equal to 0.5.

LCEs 71 and 75 are dummy devices which are provided merely to equalize the delays and track any process and temperature induced delay changes. There is no adjustment in delay from these devices because both input leads carry the same time signal. LCE 73 receives inputs from each side of delay cell 57 and produces an output along a line 77. Similarly, the LCEs 71 and 75 produce outputs along lines 76 and 78, respectively. The time at which the output from the LCE 73 appears on the line 77 is midway between the times at which the outputs from the LCEs 71 and 75 appear on the lines 76 and 78. For example, if one input to LCE 73 were 0 picosecond and the other input was 62.5 picoseconds, the output of LCE 73 would be 31.25 picoseconds relative to the output of the LCE 71 when A1 is equal to about 0.5. The structure of LCE 71, 73 and 75 is repeated in a lower row of LCE 81, 83, 85, 87 and 89. This row of LCE subdivides the row immediately above by providing time divisions in LCE 83 and 87 which divide the delays previously mentioned. LCE 81, 85 and 89 are dummy devices for delay and process equalization. The output time elements are equally spaced delays. These delays are signals which form the digits of dual thermometer code. As time delays propagate from left to right, the digits of thermometer code are formed from left to right.

Figure 8A:
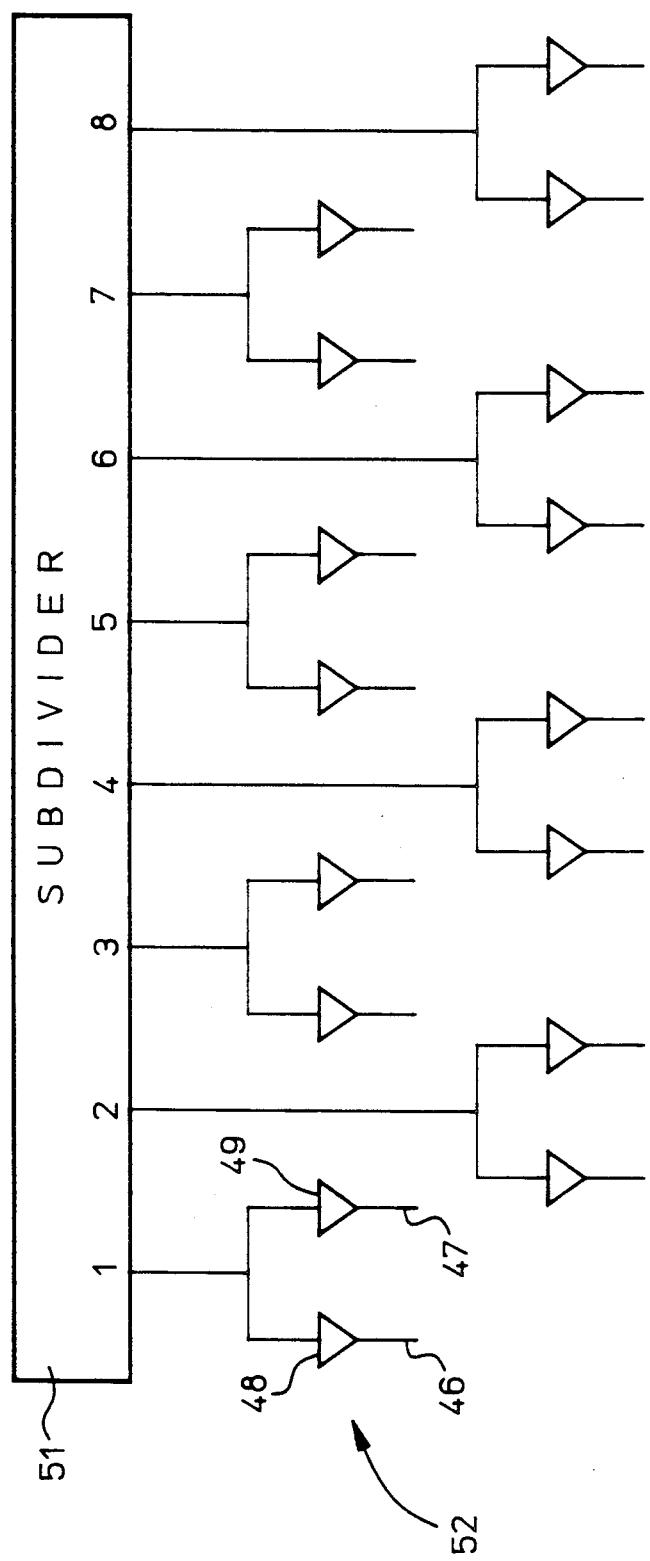
FIG. 8A is a schematic plan showing the buffer amplifier output arrangement in the interpolator of FIG. 5.

FIG. 8A shows pairs of buffer amplifiers 52 for subdivider 51. The 8 output lines of subdivider 51 are fed to a row of pairs of buffer amplifiers 52 for regeneration. Pairs are used to promote isolation between members of the pair. One output is used for an interpolated output signal sent to a latch, while the other output is available for use as an internal clock signal. While eight internal clock sources are available, only two are used, namely a first internal clock signal sent to lead-lag counters 150 and 151 in FIG. 9A and a second internal clock signal sent to delay circuit 121. The phase of the first clock is chosen such that the transitions of mux select signal on line 16 in FIG. 1 are located at plus or minus ¼ cycle relative to the transitions of the lead/lag counters.

In FIG. 8A, the first output 46 of each of the buffer pairs is isolated from the second output 47. Any loading of the second output does not affect the signal of the first output. This allows the interpolator outputs to remain the same whether or not the second outputs are connected. In fact, two of the second outputs are connected while six are not.

Figure 8B:
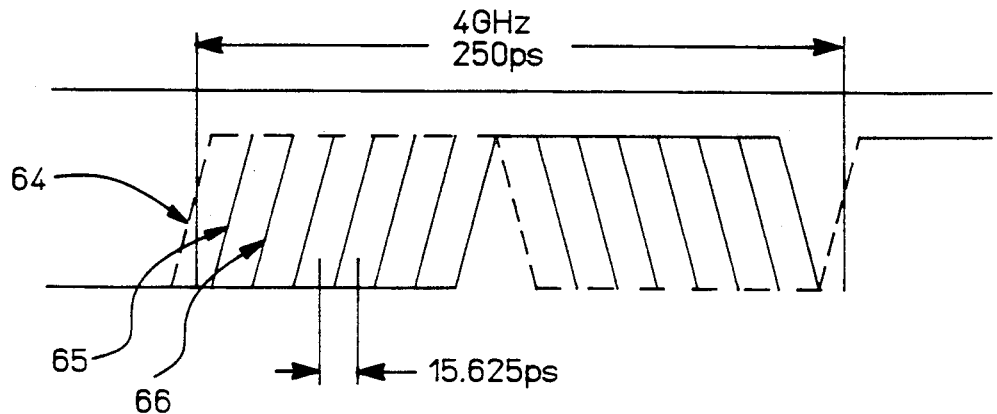
FIG. 8B is a timing diagram of the internal clock pulses from buffer amplifier outputs shown in FIG. 8A.

FIG. 8B shows the buffer interpolated output signal of thermometer code. Each waveform has a period of 250 psec (4 GHz). Waveform 64 is the output of the first buffer amplifier and is indicated by a hatched line. Waveform 65 is the output of the second; waveform 66 of the third, and so on. The delay between adjacent rising edges is shown as 15.625 psec.

Figure 9A:
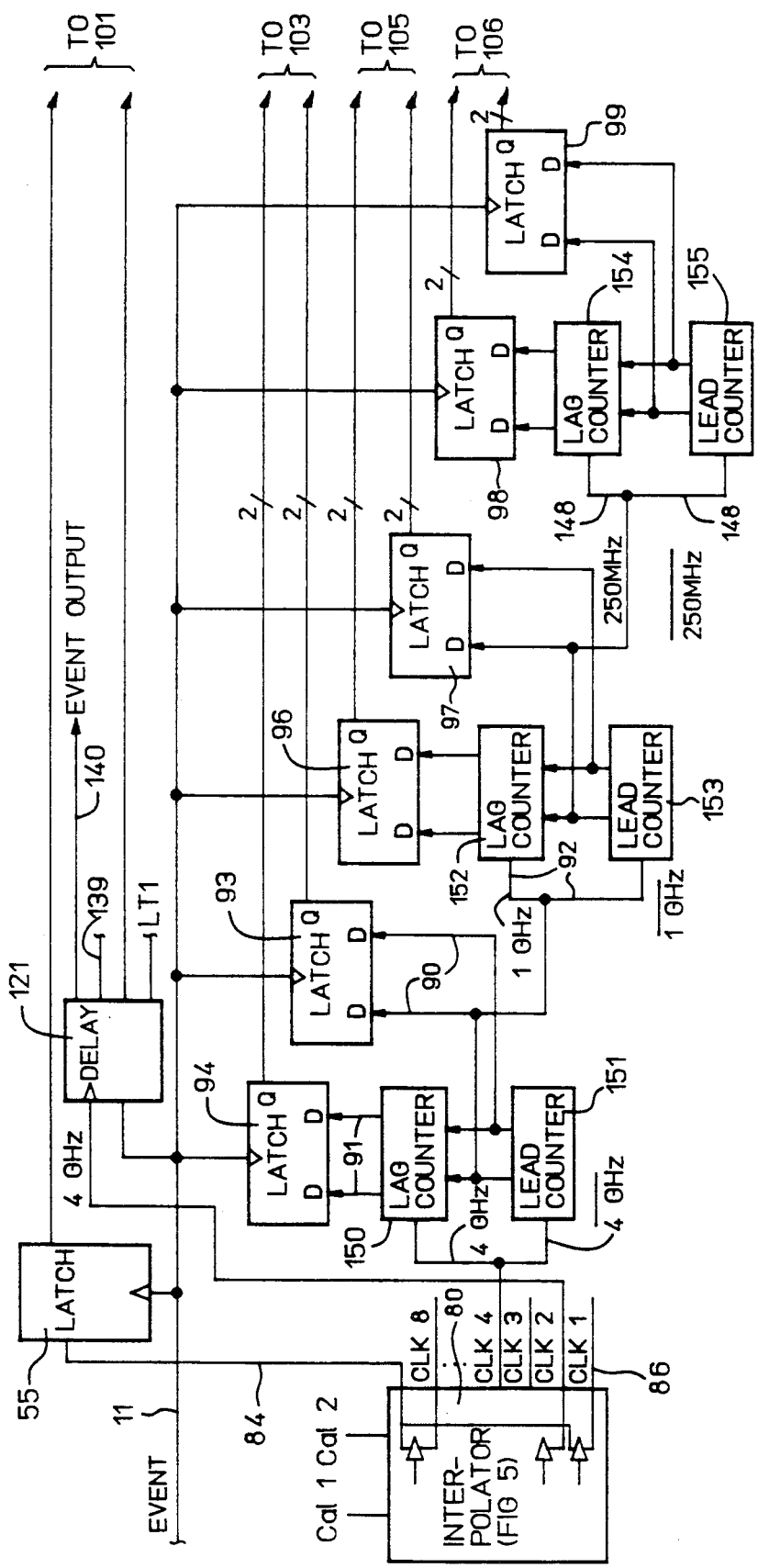
FIG. 9A is the left side and FIG. 9B is the right side of an expanded block diagram of the timing circuit illustrated in FIG. 1.
Figure 9B:
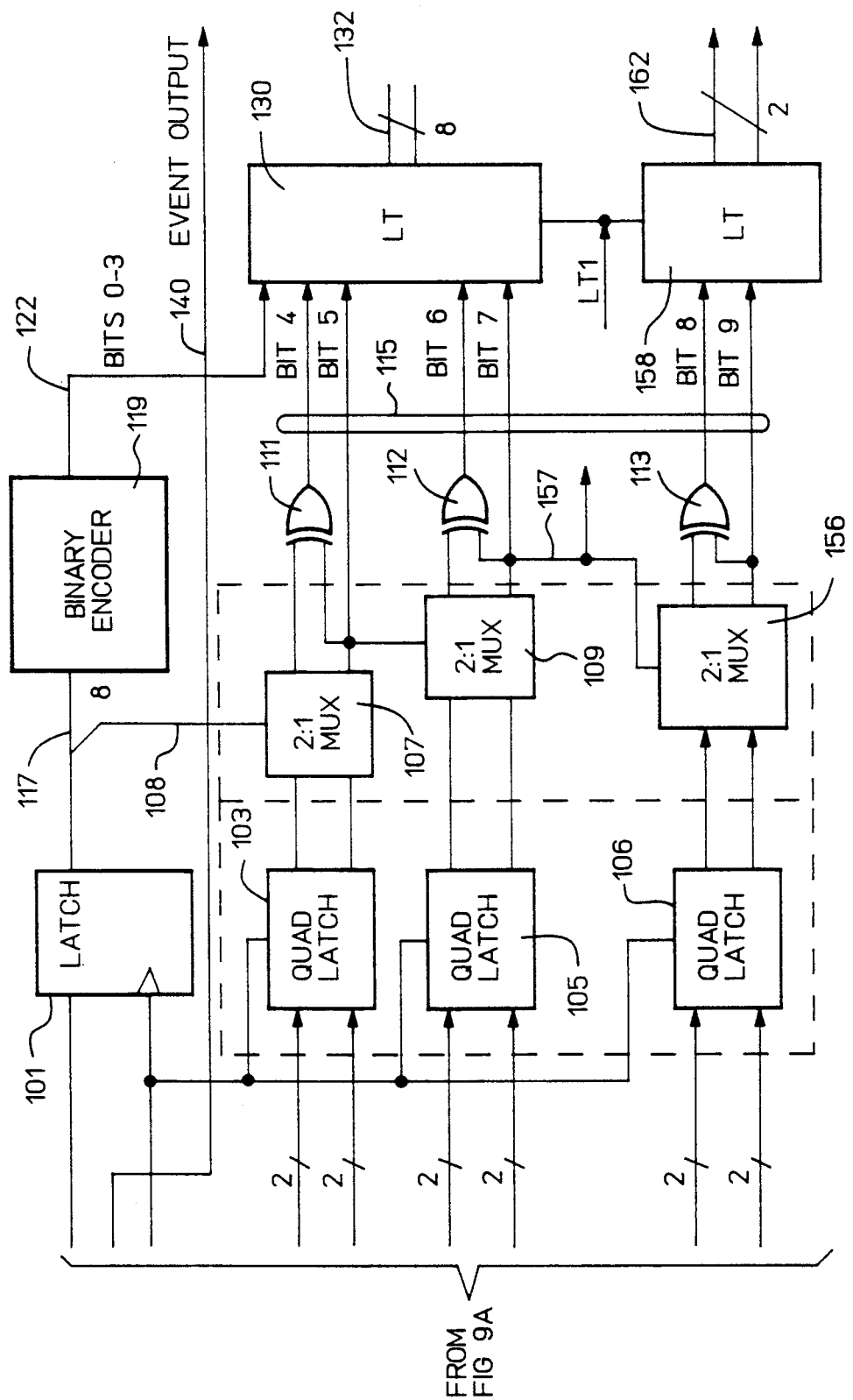

With reference to FIGS. 9A and 9B, the interpolator of FIG. 5 is shown in block 80, excluding latches. The latches are shown in FIG. 9A in relation to other circuit elements. Calibration inputs CAL1 and CAL2, in interpolator 80, are connected to lines $A_1$ and $A_2$ in the LCEs of the subdivider in FIG. 7. Small adjustments of $A_1$ and $A_2$ can be made to obtain the best uniformity in spacings of the clock pulses shown in FIG. 8B. Not shown is a frequency adjusting circuit to control the frequency of the ring oscillator to a known value. The output from the buffers in FIG. 8A, now shown as emerging from block 80, is carried on 8 lines 84 at a 4 GHz. rate and connected to the first latch means 55 which is a series of eight latches. Event line 11 is connected to latch 55.

Pairs of lead-lag counters 150 and 151 count the number of times that the dual thermometer code in the interpolator turns over to 0. A full cycle is termed the internal clock (CLK INT) as shown by waveform 34 in FIG. 2. For example, as the number of intervals counts from 0 to 15 then back to 0, then the lead-lag counters 150, 151 increment by 1. The lead and lag counters 150 and 151; 152 and 153; 154 and 155 are offset from each other and from the internal clock (CLK INT), i.e. the lag counter counts behind the CLK INT, which in turn is behind the lead counter.

Figure 12:
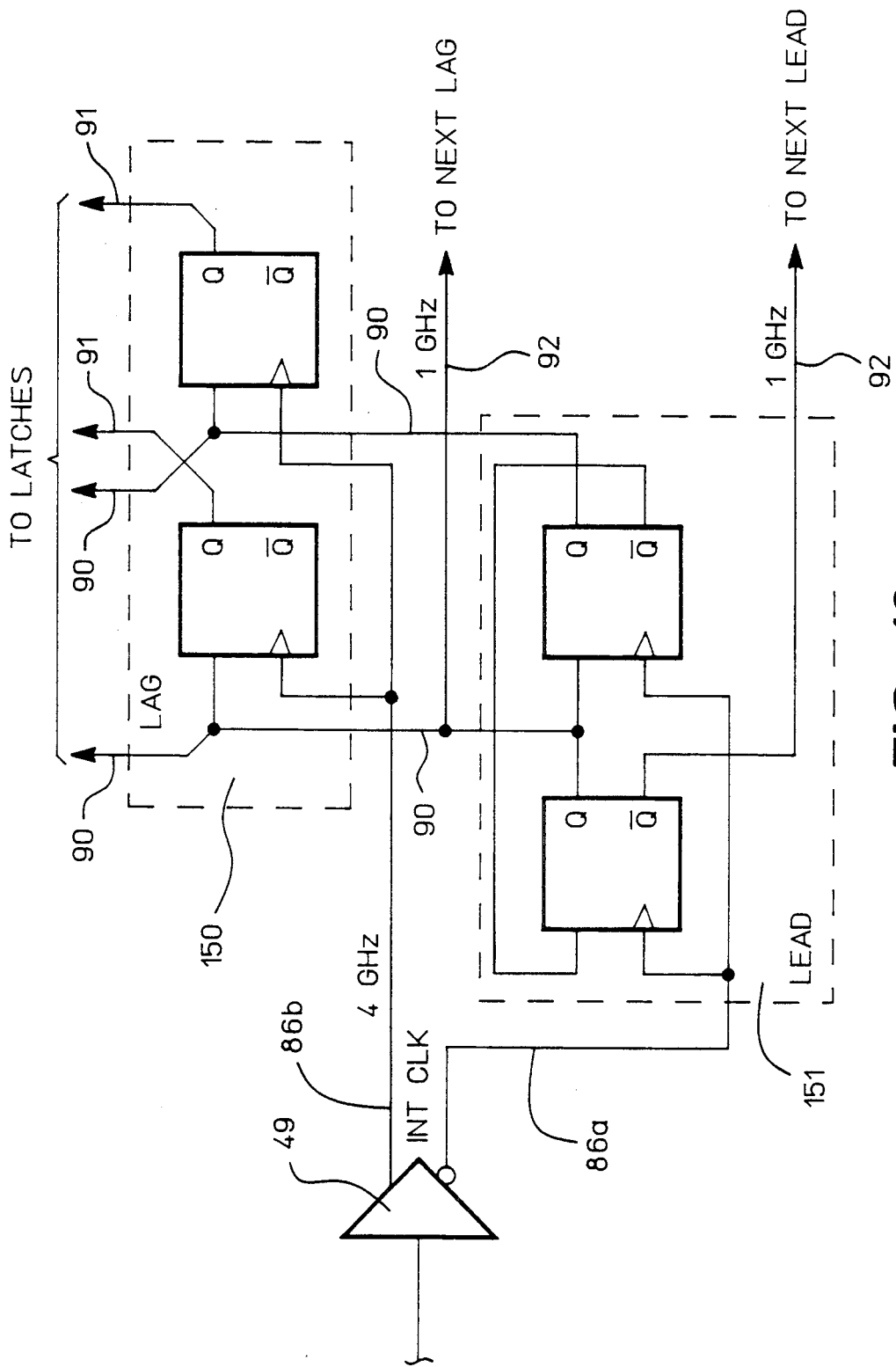
FIG. 12 is a schematic diagram of Mobius lead-lag counters illustrated in FIG. 9A.

The paired lead and lag counters 150, 151 are a Mobius configuration of flip-flops, also known as Johnson counters, as shown in FIG. 12. Each counter receives a CLK INT pulse along lines 86a and 86b at the 4 GHz rate. The CLK INT pulse comes from the output of buffer 49 in FIG. 8A. The lead and lag counters are in a master-slave relation because the output of lead counter 151 becomes the input of lag counter 150. The amount of lead is 125 ps., a one half period of the 250 ps dual thermometer code. The half cycle difference is bisected by line in FIG. 2. The output of lead counter 151, taken along lines 90, is connected to latch 93 in FIG. 9A, while the output of lag counter 150 is connected via lines 91 to latch 94 in FIG. 9A, both latches forming a second latch means. The outputs of lead counter 151 may be fed to cascaded lead counter 153 and lag counter 152 in FIG. 9A clocked at one quarter of the former rate, or 1 GHz. These slower counters will provide a greater count capability. The output of lead counter 153 is connected to latch 97, while the output of lag counter 152 is connected to latch 96, both latches forming a further portion of the second latch means. The output of counters 152, 153 at 250 MHz, taken along lines 148, is transmitted to lead-lag counters 154, 155 in FIG. 9B where a further frequency reduction occurs to 62.5 MHz. The output of the lead counter 155 is connected to a latch 99, while the output of the lag counter 154 is connected to a latch 98, both latches forming a further portion of the second latch means. The outputs of the latches 98 and 99 are transmitted to a quad latch 106.

The output of the first latch means, latch 55 in FIG. 9A, is re-latched in a third latch means, latch 101 in FIG. 9B, having an 8 line output of dual thermometer code. The output of the second latch means, from latches 93, 94, 96, 97, 98 and 99 in FIG. 9A is relatched in a fourth latch means, formed by quad latches 103, 105 and 106 in FIG. 9B. Re-latching of the outputs provides time for resolution of any prior metastable states that may have occurred in latch 55. Outputs from the fourth latch means are passed to 2:1 multiplexers 107, 109 and 156 for compression, with multiplexer 107 receiving on line 108 the most significant bit (MSB) of the least significant word from dual thermometer code latch 101 as a cue for selecting lead or lag output. Recall that the MSB of the least significant word of dual thermometer code is cyclic with the MSB uniformly changing from one to zero to one, etc. Output bit 5 from mux 107 is used as a cue for selecting, in mux 109, lead or lag output latched in quad latch 105. In turn, output bit 7 from mux 109 is used as a cue for selecting lead or lag output from counters 154 and 155 by mux 156.

With exclusive −OR gates 111, 112 and 113 at their outputs, multiplexers 107, 109 and 156 will produce six bits of binary output representing pulse counts fully tolerant of skew and jitter. These six bits, indicated by loop 115, represent the coarse event timing, while the fine timing comes from the latched dual thermometer code along line 117. This fine timing data is converted to binary code by encoder 119, which includes logic which converts thermometer code to binary, having a 4 bit output on line 122. The four bits of line 122 are read together with the six bits of loop 115 in output latches 130 and 158. Output latch 130 has eight output lines 132. Output latch 158 holds two coarse bits received from latch-mux 156. Output latch 158 has two output lines 162 which represent the most coarse output bits which are "butt-joined" to the eight bits on output lines 132. Note that latches 130 and 158 are clocked by signal LT1 derived from delay circuit 121 in FIG. 9A. The delay circuit 121 is interposed between first and third latch means, with the delay output triggering not only the third latch means, but also the fourth latch means. This delay allows time for resolution of any metastable states.

Figure 10:
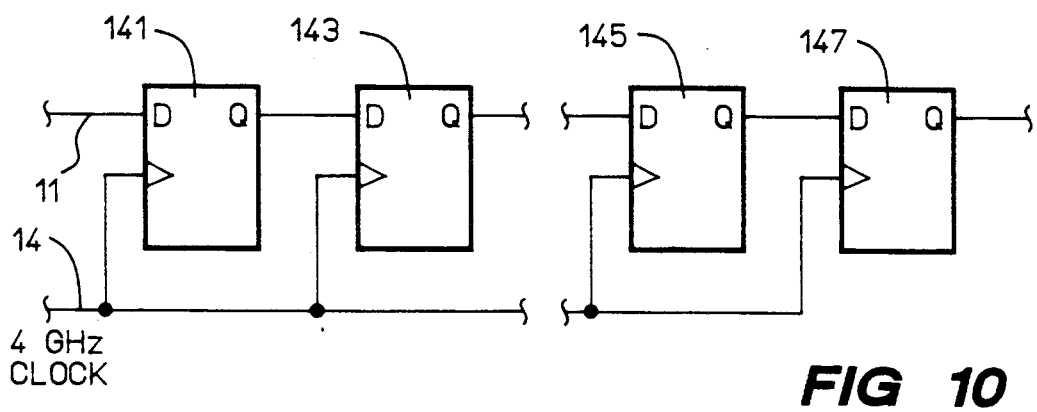
FIG. 10 is a schematic diagram of a delay circuit illustrated in FIG. 9A.

The delay circuit is shown in FIG. 10 where a number of D-type flip-flops 141, 143, . . . , 145 and 147 are arranged in series. There are actually 13 flip-flops connected in series. The event signal is then sent to flip-flop 141 on line 11. The CLK INT signal is applied along line 14, with the rising clock edge triggering an output at the Q terminal which is transmitted to the D input of flip-flop 143 where that input is clocked by the next rising edge. The circuit of FIG. 10 will delay an event signal by six to seven clock pulses. This is sufficient time to allow latch 55, shown in FIG. 9A, to stabilize. A delay signal is transmitted to third latch means 101 and to fourth latch means formed by latches 130, 158, shown in FIG. 9B.

Figure 11:
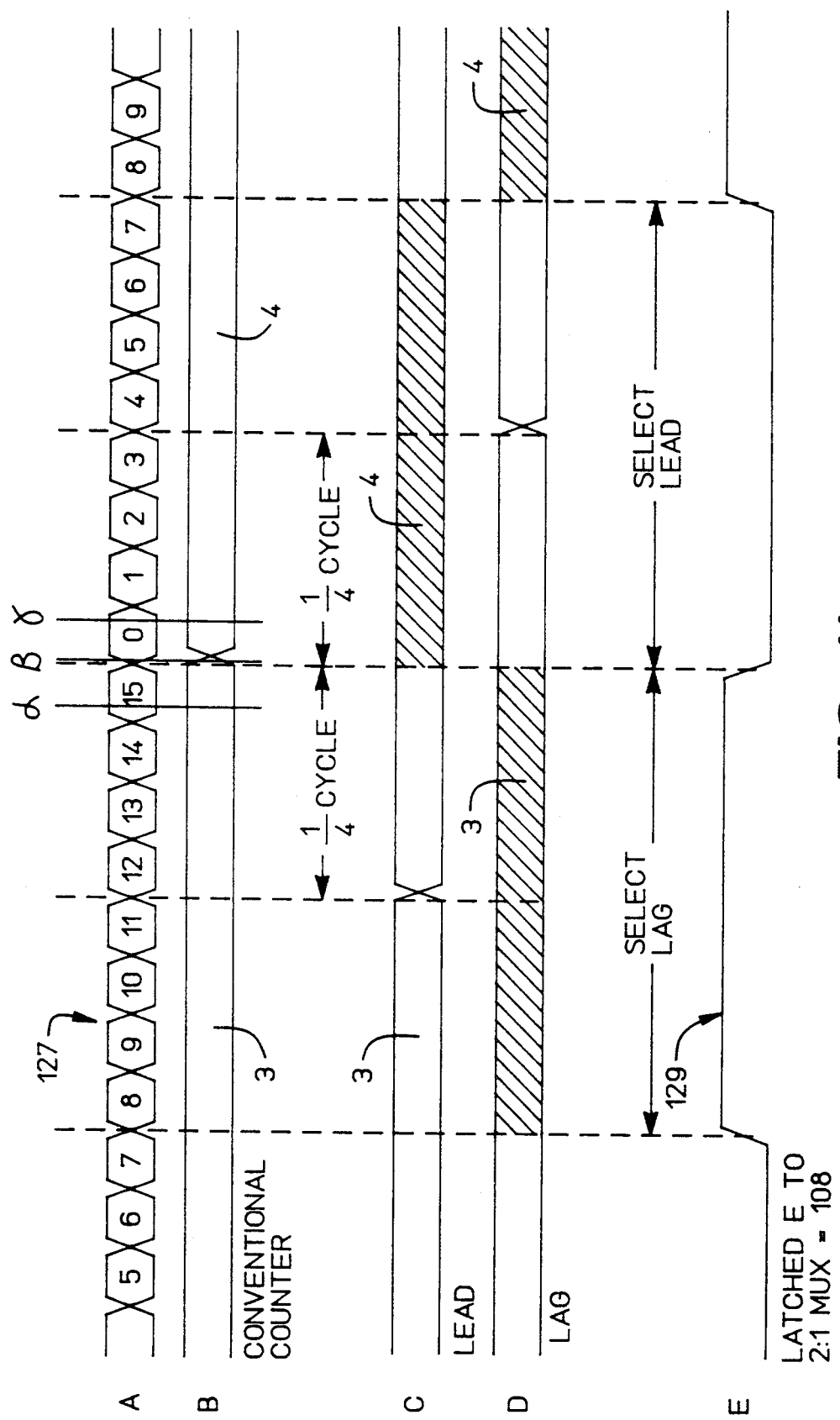
FIG. 11 shows waveform diagrams for counting circuits shown in FIGS. 9A and 9B.

In FIG. 11, the dual thermometer code is shown as a series of timing states 127, representing code subparts. The pulse count at eight thermometer code pulses, indicated by vertical dashed lines, coincides with a transition in the MUX SELECT signal 129 in plot E, appearing on line 108 in FIG. 9B. This signal is taken from the line of latch 101 in FIG. 9B which is the most significant bit (MSB) of the word in the latch. The MUX SELECT signal 129 selects either the lag counter output shown in plot D or the lead counter output, shown in plot C of FIG. 11. The MUX SELECT signal is stable for the duration until the next event. Seen in FIG. 9B, multiplexer 109 follows multiplexer 107 and multiplexer 156 follows multiplexer 109 almost immediately.

Figure 13:
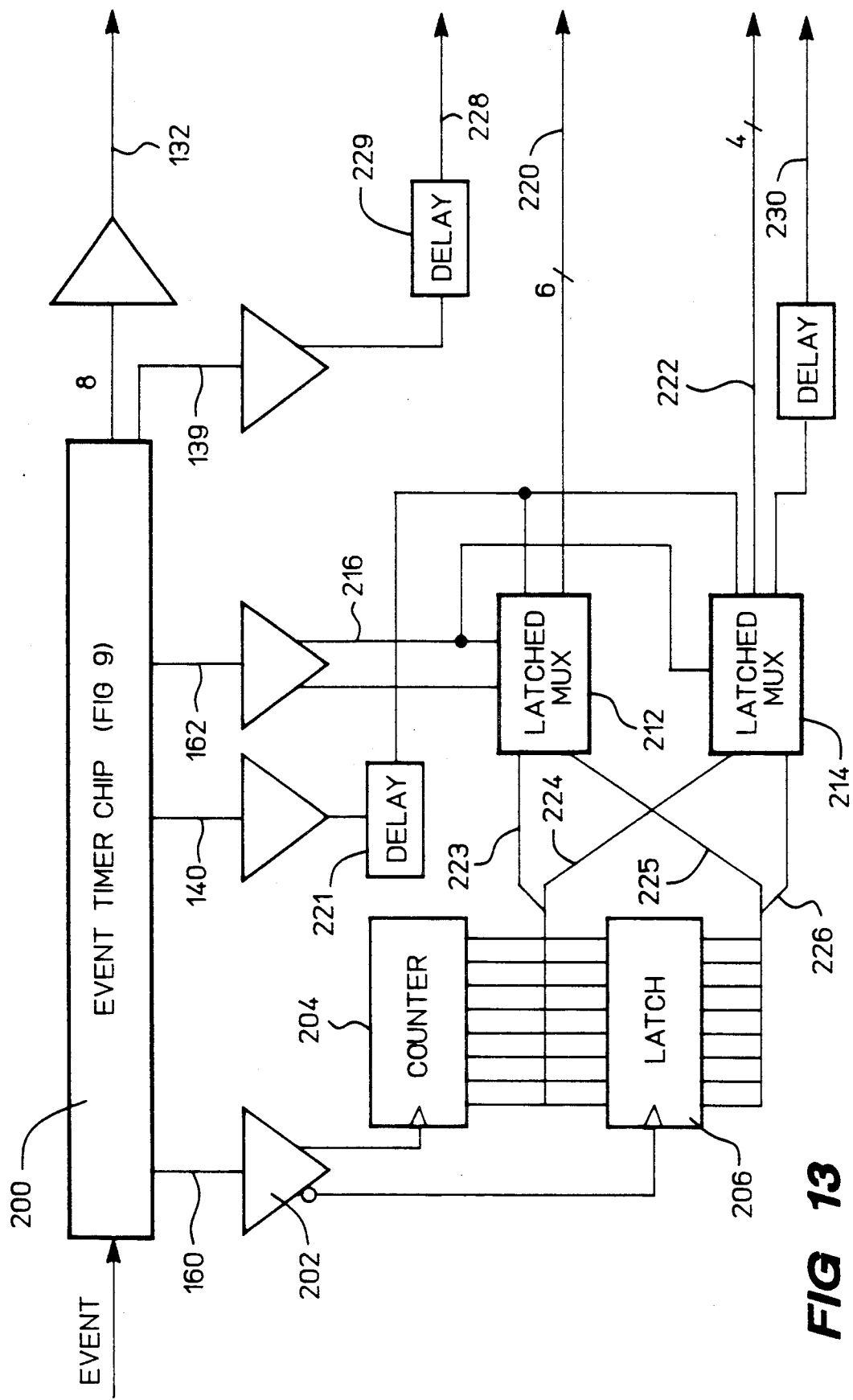
FIG. 13 is a schematic diagram of a circuit extending the timing circuit of FIGS. 9A and 9B.

Returning to FIG. 9A, it should be noted that a delayed event is available as an output along line 140. A toggled event output, i.e. going to one state on the first event then changing state on the next event is available on line 139. These event outputs are especially useful when the circuit of FIGS. 9A and 9B is manufactured as a chip, since the outputs may be used in extended circuitry, as shown in FIG. 13. While a preferable rate for CLK INT on line 86, in FIG. 9A, is 4 GHz, meaning that each clock pulse would be 250 picoseconds, other rates may be used. A preferable maximum input signal bandwidth for such a clock rate would be on the order of 500 MHz. Each 250 picosecond clock pulse was preferably subdivided into 16 subparts so that each subpart, generated by the ring oscillator and associated multiplexers, is about 15.6 ps but other subpart intervals could be used. In our example herein the lead-lag counters each count 64 subparts, 250 ps, before changing state. The multiplexer connected the counters selects a lead-lag counter at twice this rate, changing state every 8 subparts or one half clock pulse. In this manner clock pulses are identified.

With reference to FIG. 13, a count extender circuit, the event timer chip has the circuitry of FIG. 9 represented as a chip 200, with external connections, including external clock line 160 at 62.5 MHz, delayed event output line 140, the two most coarse output bit lines 162 delayed and toggled event line 139 used as a data write signal and output lines 132 with event time data in binary format. The external clock signal is stabilized by buffer 202 and transmitted to lead-lag counters. Counter 204 forms the lead counter with eight output bits, the counter counting on the leading edge of the external clock pulse. Latch 206 forms the lag counter by latching the counter's eight output bits on the trailing edge of the external clock pulse. The four most significant bits from each of the lead-lag counters is transmitted to latched 2:1 multiplexer 214, while the four least significant bits from each of the counters is transmitted to the latched 2:1 multiplexer 212. The multiplexer 212 replicates the two output bits on line 162 as the two least significant output bits from the two muxes 212 and 214. The next four output bits from multiplexer 212 are selected between the four least significant bits from lead counter 204 on line 223 or the four least significant bits from lag counter 206 on line 225, with selection being made by the bit on line 216, the most significant bit of the code. Multiplexer 214 has an output of the four most significant bits in the count. These are derived either from lead counter 204 on line 224 or from lag counter 206 on line 226. The two choices are selected by a signal by the most significant bit on line 216 mentioned previously, with the lead counter output being selected if the select bit is a zero and the lag counter output being selected for a one. These outputs are taken on lines 220, 222, yielding 10 bits including the two replicated bits from line 162. The event signal on line 140 is delayed by about 625 ps at delay 221 prior to delivery to the clock terminal of each of the multiplexers 212 and 214. This allows the advanced phase of the event signal on line 140 to be matched with the retarded phase of the clock signal on line 160. A WRITE output signal pertaining to the eight least significant output bits from chip 200 is delivered on line 228 after passing through delay 229. Similarly, a WRITE output signal for the ten most significant output bits from the auxiliary circuitry of FIG. 13 is delivered on line 230. Both write signals may be transmitted to a storage device where the timer data is used.

It is possible to cascade this circuit even further, thereby extending the measured time between events. The method of extension would be analogous to the present extension.

We claim:

1. A circuit for providing a digital output signal indicative of the time at which an event signal occurs, the circuit comprising:

ring oscillator means that generates a train of uniformly-spaced clock pulses having a predetermined clock period;

coarse timing means that receives the clock pulses and provides a coarse time signal indicative of times at which the clock pulses occur;

an interpolator that receives the clock pulses and provides a fine time signal having a period that is an integral sub-multiple of the predetermined clock period;

coarse latch means that receives the event signal and latches the coarse time signal when the event occurs, thereby providing a coarse time-of-event signal;

fine latch means that receives the event signal and latches the fine time signal when the event signal occurs, thereby providing a fine time-of-event signal; and output means that receives the coarse and fine time-of-event signals and combines them into a digital output signal having a plurality of least-significant bits indicative of the fine time signal and a plurality of most-significant bits indicative of the coarse time signal.

2. A circuit as in claim 1 wherein the ring oscillator means comprises a Walker oscillator characterized by a duty cycle of fifty per cent plus or minus not more than about one per cent.

3. A circuit as in claim 1 wherein the period of the clock pulses is controlled by an external standard.

4. A circuit as in claim 1 wherein the interpolator comprises a plurality of linear combiner elements interconnected hierarchically with the ring oscillator means.

5. A circuit as in claim 4 wherein the linear combiner elements are tunable.

6. A circuit as in claim 1 wherein the fine time signal comprises a periodic code in which only one bit differs between any two adjacent states.

7. A circuit as in claim 1 wherein the fine latch means comprises first and second fine latches, the first latch in communication with the event signal, the second latch in communication with the first and having a delay relative thereto.

8. A circuit as in claim 1 wherein the coarse timing means comprises a plurality of Mobius flip-flops.

9. A circuit as in claim 1 wherein the coarse timing means comprises two timing means offset in phase with respect to each other.

10. A circuit as in claim 9 wherein the coarse latch means comprises first and second coarse latches, the first latch in communication with the event signal, the second latch in communication with the first and having a delay relative thereto and operative to select between the two timing means.

11. A circuit for providing a digital output signal indicative of the time at which an event signal occurs, the circuit comprising:

ring oscillator means that generates a train of uniformly-spaced clock pulses having a predetermined clock period;

first and second coarse time counters, offset in phase relative to each other, that receive the clock pulses and provide first and second coarse time signals indicative of times at which the clock pulses occur;

multiplex and latch means that receive the event signal and the first and second coarse time signals and that latch one of the coarse time signals when the event signal occurs, thereby providing a coarse time-of-event signal;

an interpolator that receives the clock pulses and provides a fine time signal having a period that is an integral sub-multiple of the predetermined clock period;

fine latch means that receives the event signal and latches the fine time signal when the event signal occurs, thereby providing a fine time-of-event signal; and output means that receives the coarse and fine time-of-event signals and combines them into a digital output signal having a plurality of least-significant bits indicative of the fine time signal and a plurality of most-significant bits indicative of the coarse time signal.

12. A circuit as in claim 11 wherein the first and second coarse time counters are symmetrically offset in phase.

13. A circuit for providing a digital output signal indicative of the time at which an event signal occurs, the circuit comprising:

a ring oscillator including a plurality of delay cells that generate a train of uniformly-spaced clock pulses having a predetermined clock period;

first and second coarse time counters, offset in phase relative to each other, that receive the clock pulses and provide first and second coarse time signals indicative of times at which the clock pulses occur;

multiplex and latch means that receive the event signal and the first and second coarse time signals and that latch one of the coarse time signals when the event signal occurs, thereby providing a coarse time-of-event signal;

an interpolator including a plurality of linear combiner elements hierarchically arranged to receive the clock pulses and provide a fine time signal having a period that is an integral sub-multiple of the predetermined clock period;

fine latch means that receives the event signal and latches the fine time signal when the event signal occurs, thereby providing a fine time-of-event signal; and digitizer output means that receives the coarse and fine time-of-event signals and combines them into a digital output signal having a plurality of least-significant bits indicative of the fine time signal and a plurality of most-significant bits indicative of the coarse time signal.

14. A circuit as in claim 13 wherein the first and second coarse time counters comprise lead and lag counters.

15. A circuit as in claim 14 wherein each counter counts at one-half the clock pulse rate.

16. A circuit as in claim 13 wherein the ring oscillator comprises two delay cells connected in a loop.

17. A circuit as in claim 13 wherein the interpolator comprises a linear combiner element that receives two input pulses and provides an output pulse at a time that is intermediate between the times at which the input pulses are received.

18. A circuit as in claim 17 wherein the output pulse is provided at a time that is midway between the times at which the input pulses are received.

19. A circuit as in claim 13 wherein the fine time signal comprises a periodic code in which only one bit differs between any two adjacent states.

20. A circuit as in claim 19 wherein the periodic code comprises a dual thermometer code.

* * * * *